(12) United States Patent
Akabori et al.

(10) Patent No.: US 7,945,922 B2
(45) Date of Patent: May 17, 2011

(54) ELECTRONIC DEVICE

(75) Inventors: Takahiro Akabori, Gunma (JP);
Yoshinori Toma, Tokyo (JP); Takayuki Tateno, Chiba (JP)

(73) Assignee: Sony Corporation, Tokyo (JP)

( * ) Notice: Subject to any disclaimer, the term of this patent is extended or adjusted under 35 U.S.C. 154(b) by 639 days.

(21) Appl. No.: 12/026,777

(22) Filed: Feb. 6, 2008

(65) Prior Publication Data
US 2008/0252187 A1 Oct. 16, 2008

(30) Foreign Application Priority Data

Mar. 14, 2007 (JP) ................................ P2007-065302

(51) Int. Cl.
*G11B 33/02* (2006.01)
(52) U.S. Cl. ...................................................... 720/646
(58) Field of Classification Search .................. 720/646, 720/601, 648, 647, 602, 607, 612, 640, 636
See application file for complete search history.

(56) References Cited

U.S. PATENT DOCUMENTS

| 7,318,232 | B2* | 1/2008 | Masuhara et al. | 720/718 |
| 7,554,802 | B2* | 6/2009 | Tsai | 361/679.33 |
| 2005/0066344 | A1* | 3/2005 | Lin | 720/646 |
| 2005/0114874 | A1* | 5/2005 | Hsieh | 720/646 |
| 2005/0226137 | A1* | 10/2005 | Masuhara et al. | 369/275.5 |

FOREIGN PATENT DOCUMENTS

| JP | 2004-284439 | 10/2004 |
| JP | 2005-313330 | 11/2005 |

* cited by examiner

*Primary Examiner* — Allen T Cao
(74) *Attorney, Agent, or Firm* — Oblon, Spivak, McClelland, Maier & Neustadt, L.L.P.

(57) ABSTRACT

An electronic device is provided. The electronic device includes a housing, a front panel, a strip-shaped decorative member and a projecting portion. The front panel is provided to the housing. The strip-shaped decorative member has a predetermined width and is arranged on the front panel. The projecting portion is integrally formed with the strip-shaped decorative member and includes a surface inclined in a depth direction at a position having a predetermined distance from a front edge of a lower surface of the strip-shaped decorative member. The strip-shaped decorative member including the projecting portion is attached to the front panel while the surface inclined in the depth direction being exposed to a front side.

4 Claims, 6 Drawing Sheets

ELECTRONIC DEVICE

CROSS REFERENCES TO RELATED APPLICATIONS

The present invention contains subject matter related to Japanese Patent Application JP 2007-065302 filed in the Japanese Patent Office on Mar. 14, 2007, the entire contents of which being incorporated herein by reference.

BACKGROUND OF THE INVENTION

1. Field of the Invention

The invention relates to an electronic device suitable to be applied to, for example, an audio apparatus and a video apparatus, and particularly relates to an electronic device having a silver or other strip-shaped decorative member at a front panel of the device.

2. Description of the Related Art

Front panels of various electronic devices such as a disc reproduction apparatus have been provided with a decorative member formed of synthetic resin to improve design of such front panels. Plating is carried out on the surface of such decorative members so that the member has a distinguished appearance.

An electronic device such as a disc reproduction apparatus that reproduces data recorded on DVD (Digital Versatile Disk) or other discs includes a strip-shaped decorative member arranged on a front panel to divide the panel into an upper portion and a lower portion. A disc tray for loading a disc is arranged on the lower side of the strip-shaped decorative member and a display panel or the like is arranged on the upper side thereof. The design of the disc reproduction apparatus may be improved with such configuration.

Japanese Unexamined Patent Application Publication No. 2004-284439 discloses a plated emblem that is made of resin and provided to an external facing. Japanese Unexamined Patent Application Publication No. 2005-313330 discloses a technology of molding a resin component having a rib.

SUMMARY OF THE INVENTION

In the case of attaching a decorative member such as a decorative strip made of molded resin to a housing of a device, it has been difficult to substantially reduce the thickness of the decorative member. Specifically, when arranging a long decorative strip of about 3 mm in width (thickness) at a front panel of the device, a reinforcing rib or other reinforcing member may need to be provided on the rear side of the strip so that sufficient strength is obtained as the front panel of the device with only the thickness of 3 mm. Here, in the case of arranging the decorative member that is visible on the front panel, it may be difficult to provide such reinforcing rib on the rear side thereof.

Accordingly, in the case of arranging such thin strip-shaped decorative member on the front panel or other parts of the housing, a certain thickness may be needed, even if the appearance thereof becomes unattractive, as the minimum thickness for obtaining such strength. Alternatively, other members using expensive materials that may be thin but have a sufficient strength can be used, however, it is not favorable to use such expensive materials for the decorative member at the front panel of an electronic device such as an audio apparatus and video apparatus, because the production cost of the device may increase.

Also, in the case of providing a reinforcing rib on the rear side of the strip-shaped decorative member, there is a high possibility of generating deformation or a sink mark on the front side of the strip-shaped decorative member. Such sink mark may be unfavorable for a component arranged on the front panel of the device. Japanese Unexamined Patent Application Publication No. 2005-313330 describes such sink mark generated when providing a reinforcing rib to a resin component.

It is desirable to provide an electronic device in which a decorative member attached to a housing thereof has a less thickness and no sink marks.

According to an embodiment of the invention, there is provided an electronic device with a strip-shaped decorative member having a predetermined width arranged on a front panel of a housing. A projecting portion is provided on a lower surface of the strip-shaped decorative member. The projecting portion is integrally formed with the strip-shaped decorative member and includes a surface inclined in a depth direction at a position having a predetermined distance from a front edge of the lower surface of the strip-shaped decorative member. The strip-shaped decorative member including the projecting portion is attached to the front panel while the surface inclined in the depth direction being exposed to a front side.

Accordingly, the projecting portion on the lower side of the strip-shaped decorative member serves as a reinforcing member, enabling the width of the strip-shaped decorative member exposed to the front side to be thin. If plating is carried out, for example, on the surface of the strip-shaped decorative member to have a mirror surface reflecting the environment thereof and the front panel facing the lower surface of the strip-shaped decorative is approximately black, the plated inclined surface of the projecting portion on the lower side of the strip-shaped decorative member reflects the black surface of the front panel. Therefore, if the whole surface of the strip-shaped decorative member is plated, the projecting portion on the lower side is seen in black and less obvious as if there were no projecting portion on the decorative strip. Accordingly, the arranged strip-shaped decorative member can be shown on the front panel as if the width (thickness) thereof were thin.

According to the embodiment of the invention, the strip-shaped decorative member can be arranged on the front panel with the thickness thereof being less obvious so that design of the electronic device having the strip-shaped decorative member arranged on the front panel can be improved. Here, the projecting portion is formed with resin integrally molded with the lower side of the strip-shaped decorative member. Hence, production cost or the like can be prevented from increasing and the design thereof can be improved at low cost. Furthermore, according to the embodiment of the invention, there may be no need to provide a reinforcing rib on the rear side of the strip-shaped decorative member, so that the strip-shaped decorative member with a smooth surface having no sink mark can be arranged as compared to a decorative member where such reinforcing member is formed.

DESCRIPTION OF THE PREFERRED EMBODIMENTS

An embodiment of the invention is herein described with reference to the attached drawings.

The embodiment of the invention is applied to an electronic device such as a video apparatus and an audio apparatus configured as a disc reproduction apparatus (or disc recording and reproduction apparatus) that reproduces video data recorded on discs such as DVDs or audio signals recorded on optical discs.

Figure 1:
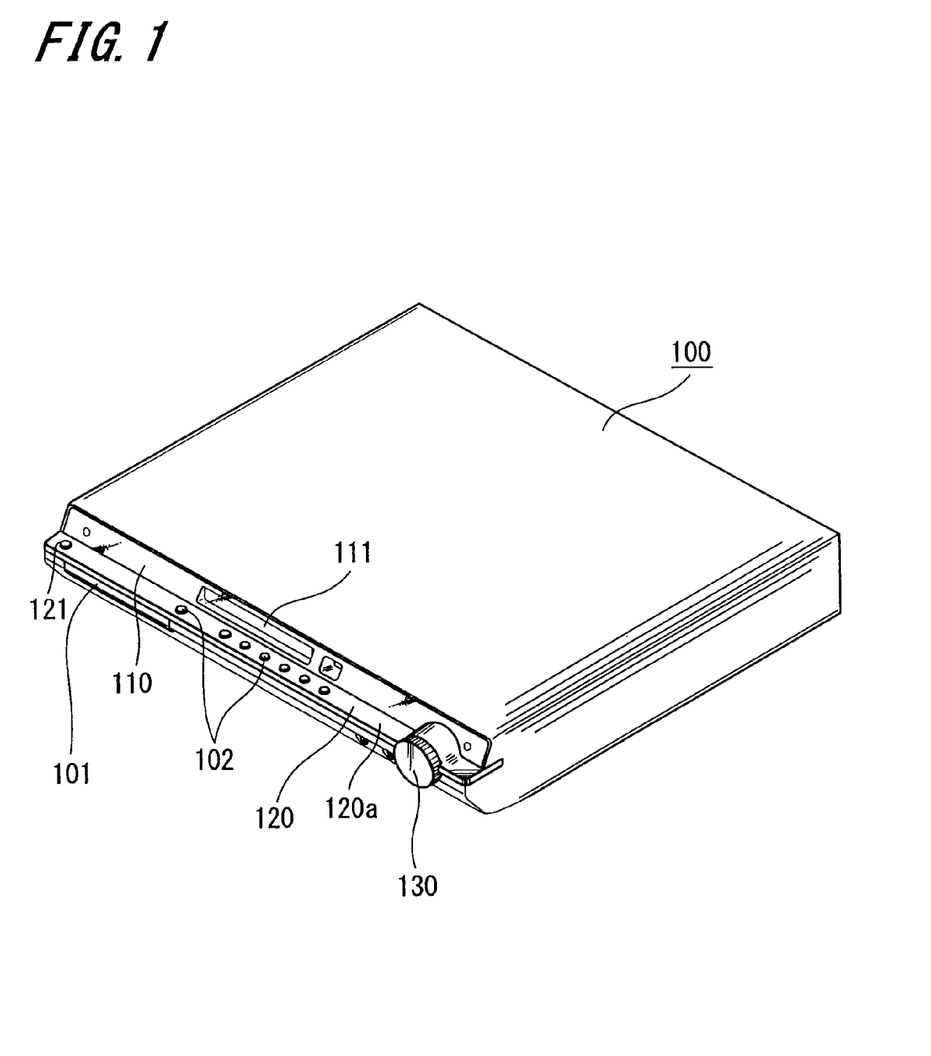
FIG. 1 is a perspective view showing an example of an external appearance of a disc reproduction apparatus according to an embodiment of the invention.
Figure 2:
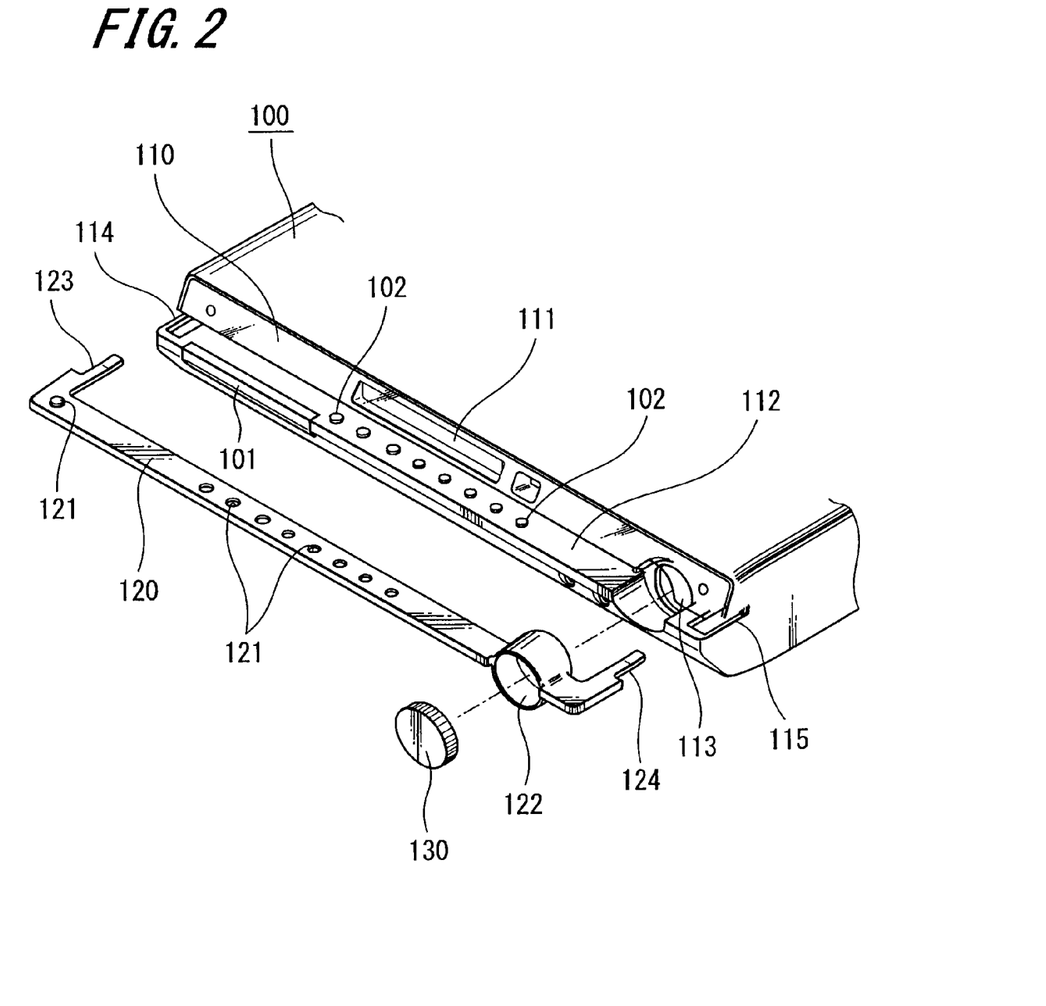
FIG. 2 is an exploded perspective view showing in an exploded manner the vicinity of a front panel of a disc reproduction apparatus according to an embodiment of the invention.
Figure 3:
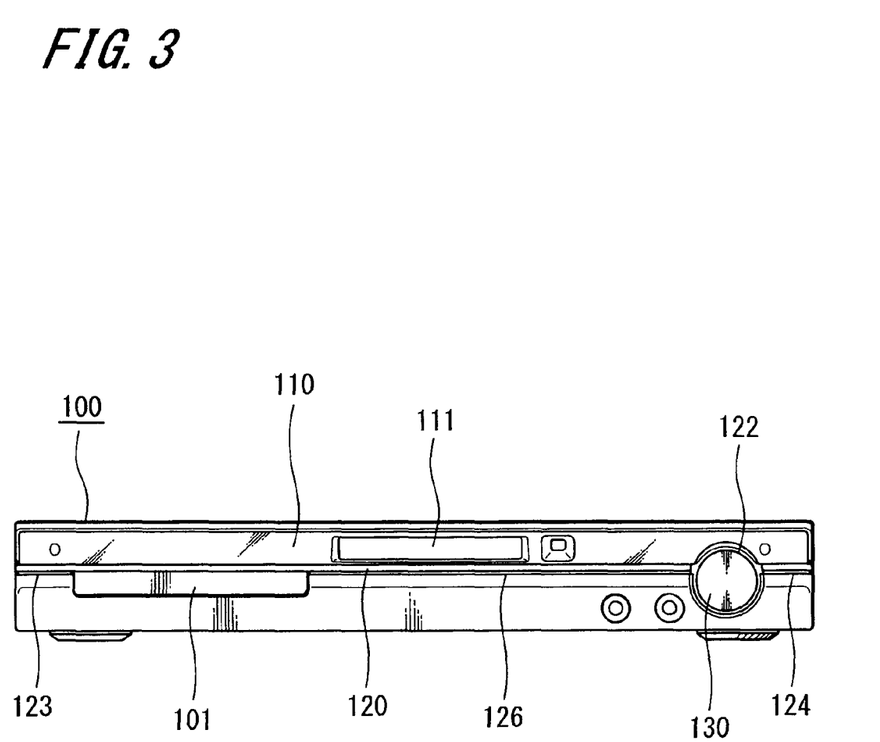
FIG. 3 is a front view showing the front side of a disc reproduction apparatus according to an embodiment of the invention.
Figure 4:
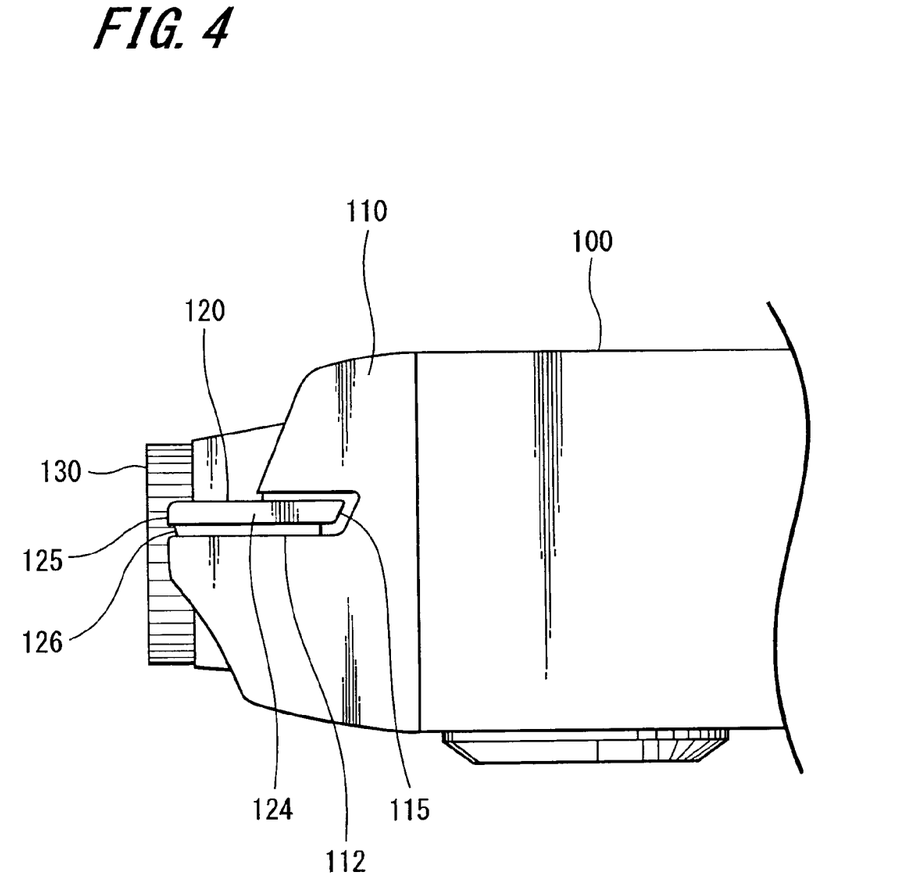
FIG. 4 is a side view showing in an enlarged manner the vicinity of a front panel of a disc reproduction apparatus according to an embodiment of the invention.
Figure 5:
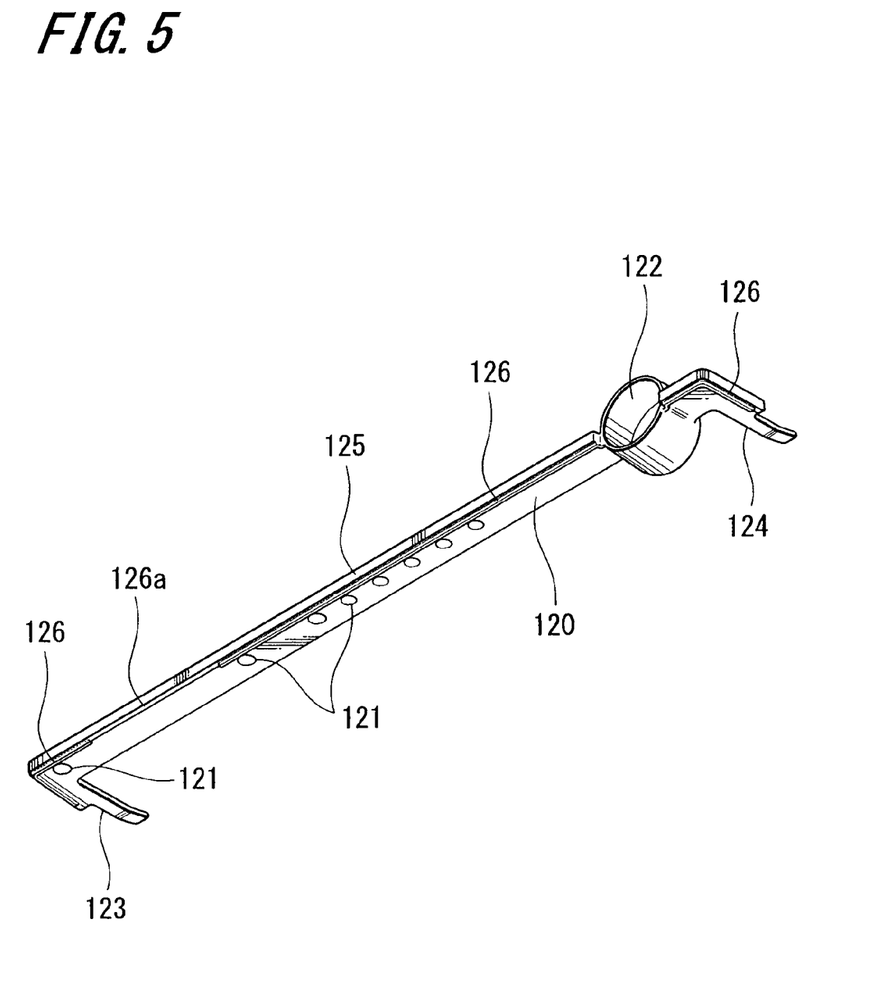
FIG. 5 is a perspective view of a strip-shaped decorative member attached to a disc reproduction apparatus according to an embodiment of the invention when seeing obliquely upward.
Figure 6A:
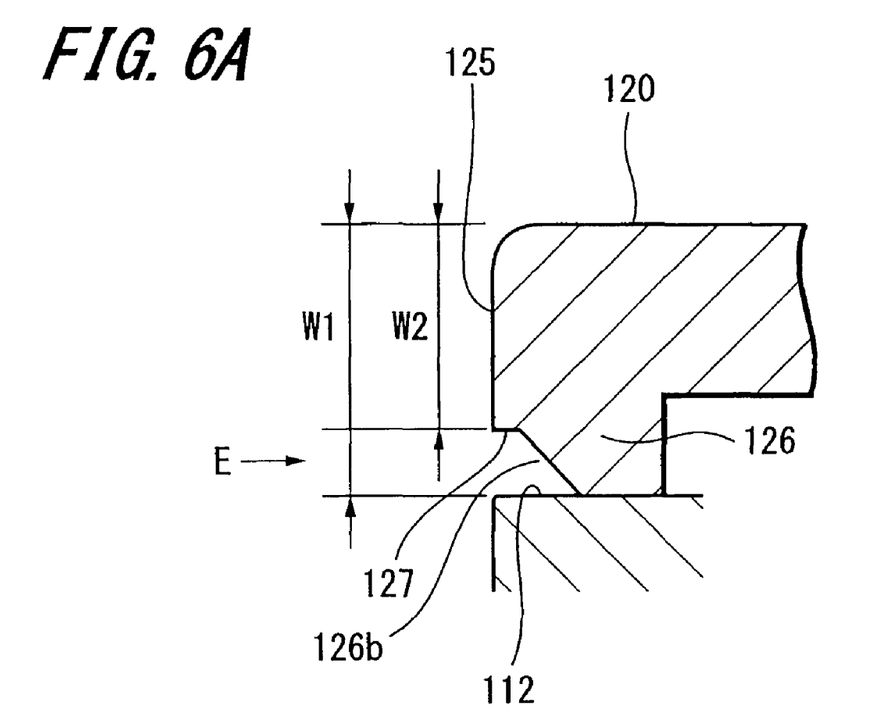
FIG. 6A is a sectional view of a strip-shaped decorative member attached to the apparatus shown in FIG. 1
Figure 6B:
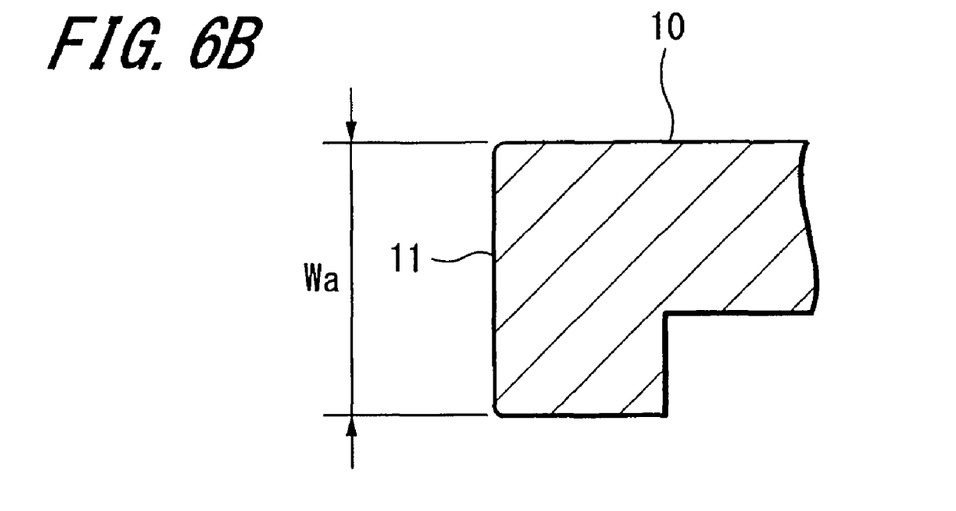
FIG. 6B is a sectional view of the related art for comparison.

FIG. 1 is a diagram showing an example of the whole configuration of a disc reproduction apparatus according to the embodiment of the invention. FIG. 2 is a diagram showing in an exploded manner a front panel portion of the disc reproduction apparatus according to the embodiment of the invention. FIG. 3 is a diagram showing the front side of the disc reproduction apparatus. FIG. 4 is an enlarged side view showing a front portion of the disc reproduction apparatus. FIG. 5 is a perspective view of a strip-shaped decorative member attached to the front panel portion of the disc reproduction apparatus when seeing obliquely upward. FIG. 6A is a diagram showing a cross section of main parts of the strip-shaped decorative member. FIG. 6B is a diagram showing an example of configuration of the related art compared to the configuration of the embodiment of the invention.

First, the whole configuration of a disc reproduction apparatus according to an embodiment of the invention will be described with reference to FIG. 1. A disc reproduction apparatus 100 is formed within a box-shaped housing. A front panel portion 110 molded with resin is attached to the front of the housing. The front panel portion 110 is comparatively large and has the length of approximately 43 cm in the lateral direction. A strip-shaped decorative member 120 is arranged horizontally on the front panel portion 110 continuously from the left end to the right end to divide the front surface into an upper portion and a lower portion. The strip-shaped decorative member 120 is formed to have an exposed upper plane 120a on which a plurality of operational buttons 102 are arranged. In addition, a rotary knob 130 is provided at the right end of the strip-shaped decorative member 120.

A disc tray 101 is arranged at the left end on the lower surface of the front panel portion 110 that is divided into the upper and lower portions by the strip-shaped decorative member 120. The disc tray 101 is pulled to open when loading a disc. A display window 111 is arranged at the center of the upper surface of the front panel portion 110. A display device such as a fluorescent display tube and a liquid crystal panel is arranged in the display window 111 to display characters, numerals, graphics and the like to indicate a disc reproduction state or other operating states. Other members such as an operational switch and a window for receiving an infrared signal may also be arranged on the upper surface around the display window 111.

The strip-shaped decorative member 120 dividing the front panel portion 110 into the upper portion and the lower portion is formed by plating a resin member to have a silver mirror surface. It should be noted that the surface here may not be mirror-finished completely but may reflect the surroundings to some extent. The other portion of the front panel portion 110 is formed of a black or dark color member. A transparent or translucent resin plate is arranged on the display window 111 and the surrounding thereof.

FIG. 2 is a diagram showing the front panel portion 110 in an exploded manner. As shown in FIG. 2, the strip-shaped decorative member 120 is prepared as a member molded with resin separately from the resin member constituting the front panel portion 110. As shown in FIG. 2, the strip-shaped decorative member 120 is formed of a thin plate and placed on a horizontal surface 112 of the front panel portion 110. The plurality of operational buttons 102 are arranged on the horizontal surface 112 of the front panel portion 110. The strip-shaped decorative member 120 has a plurality of button holes 121 at a position corresponding to the position of the operational buttons 102. The operational buttons 102 are projected through the button holes 121 of the strip-shaped decorative member 120 to be operated in the assembled state as shown in FIG. 1.

Holding portions 114 and 115 are respectively formed at left and right ends of the horizontal surface 112 of the front panel portion 110 so that the left and right ends of the strip-shaped decorative member 120 are respectively held at the holding portions 114 and 115 when being assembled. Further, as shown in FIG. 2, the left and right ends of the strip-shaped decorative member 120 respectively include inserted portions 123 and 124 extending long in a depth direction of the disc reproduction apparatus 100 so that the inserted portions 123 and 124 are inserted in the inside of the holding portions 114 and 115 of the front panel portion 110 when being assembled.

A knob attaching portion 122 having an expanded cylindrical shape is formed at a position toward the right end of the strip-shaped decorative member 120. When assembling the disc reproduction apparatus 100, the knob attaching portion 122 is positioned at the front of a knob attaching hole 113 of the front panel portion 110 and the rotary knob 130 fitted into the knob attaching portion 122 is connected to a rotary switch mechanism (e.g., rotary encoder), enabling various rotary operations to be carried out.

FIG. 3 is a front view of the assembled disc reproduction apparatus 100 to which the strip-shaped decorative member 120 and other members have been attached. The strip-shaped decorative member 120 has a thickness of several millimeters and is continuously arranged at the front of the disc reproduction apparatus 100 from the left end to the right end. A projecting portion 126 is approximately continuously formed on the lower side of the strip-shaped decorative member 120. The projecting portion 126 is formed with resin integrally molded with the strip-shaped decorative member 120 and plated at the time when plating the strip-shaped decorative member 120. It should be noted that only a portion above the disc tray 101 is not provided with the projecting portion 126 as shown in FIG. 3. The portion without the projecting portion 126 is defined as a projection-free portion 126a (see FIG. 5). The projection-free portion 126a has the length of about 13 cm that corresponds to the width of the disc tray 101 loading a disc having the diameter of about 12 cm.

The strip-shaped decorative member 120 provided with the projecting portion 126 is described in detail with reference to FIGS. 4, 5, and FIGS. 6A and 6b. As shown in FIG. 5 illustrating the lower surface of the strip-shaped decorative member 120, the projecting portion 126 is continuously arranged on the lower surface of a front edge portion 125 of the strip-shaped decorative member 120. However, the projecting portion 126 is not provided to the knob attaching portion 122 circular-projected and the projection-free portion 126a where the disc tray 101 is positioned when being assembled.

As shown in the sectional view in FIG. 6A, the projecting portion 126 is provided to the strip-shaped decorative member 120 at a position having a distance corresponding to a minimal step portion 127 of approximately 0.8 mm provided in the depth direction from the front edge portion 125. The projected height of the projecting portion 126 is approximately 1 mm. A surface 126b of the projecting portion 126 is inclined rearward as the height thereof is lowered. The angle of inclination of the surface 126b is here approximately 45°. The surface 126b is also colored silver when plating or coating the whole of the strip-shaped decorative member 120.

It should be noted that a width W1 shown in FIG. 6A representing the width of the whole strip-shaped decorative member 120 (that is, including the width of the projecting portion 126) is the minimum width to obtain a necessary strength as the strip-shaped decorative member 120. For example, the width W1 is 4 mm. A width W2 excluding the width of the projecting portion 126 is, for example, 3 mm. Accordingly, the strip-shaped decorative member 120 is made so thin that a sufficient strength may not be obtained if the projecting portion 126 is not provided. It should be noted that the necessary strength herein described is the strength when the strip-shaped decorative member 120 is approximately 43 cm in length, as shown in FIG. 5.

As shown in FIG. 5, although the projection-free portion 126a is provided to the strip-shaped decorative member 120 in this embodiment, it is only provided partially and may not substantially affect the strength necessary for the strip-shaped decorative member 120 as a whole. Here, the strip-shaped decorative member 120 may need to have such strength that prevents it from being broken even if the upper surface thereof (with the operational buttons 102 arranged) receives strong force. In addition, the projection-free portion 126a is provided to the position having a distance from the position where the operational buttons 102 are arranged. Therefore, the upper plane 120a of the strip-shaped decorative member 120 above the projection-free portion 126a may not receive force when a user pushes the button or others. Hence, practically, the projection-free portion 126a is allowed to have a slightly insufficient strength compared to the other portion.

As described above, according to the disc reproduction apparatus of this embodiment, the strip-shaped decorative member 120 arranged on the front panel portion 110 has the color of silver, enabling the design of the front panel portion 110 to be improved. When the user views the front panel portion 110 from the front, the front edge portion 125 alone can be seen as the thin plate of the strip-shaped decorative member 120 that is seen as a thin silver strip. Specifically, since the surface 126b of the projecting portion 126 on the lower side of the strip-shaped decorative member 120 is exposed to the outside as shown in FIG. 6A, the surface 126b is seen from the front when the user views the front panel portion 110 from the front. However, the surface 126b is not actually obvious to the user.

Further description is given with reference to FIGS. 6A and 6B. When the user views the strip-shaped decorative member 120 on the front panel portion 110 from the front, the viewing direction is represented by an arrow E as shown in FIG. 6A. Since the surface 126b of the projecting portion 126 of the strip-shaped decorative member 120 is inclined to have an angle of approximately 45°, the horizontal black surface 112 of the front panel portion 110 is reflected on the mirror surface 126b. Hence, the silver surface 126b of the projecting portion 126 is shown black by reflecting the black surface, so that the front edge portion 125 of the strip-shaped decorative member 120 alone is shown silver for the user viewing the front panel portion 110 from the front. The horizontal surface 112 is black in this example. Alternatively, other colors not exactly black (dark colors) may be used.

Accordingly, although the strip-shaped decorative member 120 is provided with the projecting portion 126 to obtain strength and the whole width W1 has a certain width (e.g., 4 mm) as shown in FIG. 6A, the strip-shaped decorative member 120 can be seen as a thin silver strip having the width W2 (e.g., 3 mm) excluding the width of the projecting portion 126, thereby improving an appearance and the design of the front panel.

FIG. 6B shows an example of the strip-shaped decorative member for comparison which has a structure according to related art. A strip-shaped decorative member 10 without the projecting portion 126 arranged in this example may need to have a certain width (e.g., 4 mm) as the width Wa of the edge portion 11 so as to obtain strength. Therefore, the width Wa may be seen as the width of the strip-shaped decorative member 10 to the user. In contrast, the strip-shaped decorative member 120 according to the embodiment can be made thin while retaining the same strength, thereby improving the design of the front panel.

Further, according to the embodiment, since the projecting portion 126 is provided, there may be no need to provide a reinforcing rib on the rear side or the like of the strip-shaped decorative member 120, thereby preventing deformation or a sink mark from being generated on the planarized upper plane 120a of the strip-shaped decorative member 120, which also improves the design of the front panel.

It should be noted that the configuration of the front panel of the disc reproduction apparatus 100 according to the embodiment described with reference to respective drawings is an example and an embodiment is not limited to the specific configuration indicated in the figures. An embodiment of the invention can be applied to devices having various shapes in which a similar decorative member is arranged on the front panel portion. For example, an example shown in FIG. 1 is a disc reproduction apparatus including a disc tray at the left end thereof. An embodiment of the invention may also be applied to a disc reproduction apparatus or disc recording and reproduction apparatus including a disc tray at the center of the front panel. In such a case, the position of the projection-free portion 126a (see FIG. 5) of the strip-shaped decorative member 120 may need to be adjusted corresponding to the position of the disc tray.

Alternatively, in the case where the front panel portion has the shape that may not require the projection-free portion 126a of the strip-shaped decorative member 120 shown in FIG. 5, the projecting portion 126 may be formed continuously from the left end to the right end of the strip-shaped decorative member 120. With the strip-shaped decorative member 120 being arranged continuously, the strength of the strip-shaped decorative member 120 may be improved.

Furthermore, the strip-shaped decorative member 120 according to the above-described embodiment is plated to have the color of silver. Alternatively, the strip-shaped decorative member 120 may be coated to have a similar color. Other colors than silver may be used as long as the color reflects the surroundings to some extent. The above-described dimensions of respective portions of the strip-shaped decorative member 120 are also examples and the strip-shaped decorative member 120 having different dimensions may also be used.

Furthermore, the strip-shaped decorative member 120 according to the above-described embodiment is arranged on the front panel portion 110 from the left end to the right end in the lateral direction. Alternatively, a similar strip-shaped decorative member may be arranged on a part of the front panel portion 110 in the lateral direction. In addition, the strip-shaped decorative member may be arranged overall or on a part of the front panel portion 110 in the vertical direction.

Furthermore, the upper plane 120a of the strip-shaped decorative member 120 is exposed to the outside and the operational buttons 102 are arranged on such plane portion according to the configuration described in FIG. 1 and other figures. Alternatively, such upper plane portion may not be exposed to the outside. In other words, the front edge portion 125 and the surface 126b of the strip-shaped decorative member 120 alone are exposed to the outside and the other portions thereof may be hidden inside the front panel portion 110.

Moreover, the above-described embodiment is applied to the front panel of the disc reproduction apparatus (or disc recording and reproduction apparatus). It should be appreciated that an embodiment of the invention may be applied to front panels having a decorative member included in various electronic devices other than audio apparatuses and video apparatuses. For example, an embodiment of the invention can be applied to various electronic devices such as video game equipment and personal computer apparatuses in which the design of the front panel may need to be improved.

It should be understood by those skilled in the art that various modifications, combinations, sub-combinations and alterations may occur depending on design requirements and other factor insofar as they are within the scope of the appended claims or the equivalents thereof.

What is claimed is:

1. An electronic device for a recording medium comprising:
 a housing;
 a front panel provided to the housing;
 a strip-shaped decorative member having a predetermined width arranged on the front panel; and
 a projecting portion integrally formed with the strip-shaped decorative member and including a surface inclined in a depth direction at a position having a predetermined distance from a front edge of a lower surface of the strip-shaped decorative member; wherein
 the strip-shaped decorative member including the projecting portion is attached to the front panel while the surface inclined in the depth direction being exposed to a front side.

2. An electronic device according to claim 1, wherein
 the strip-shaped decorative member formed with the projecting portion is coated or plated to have reflectiveness and a surface of the front panel facing the inclined surface is black or approximately black.

3. An electronic device according to claim 1, wherein
 the strip-shaped decorative member has strength as a strip member by including the projecting portion.

4. An electronic device according to claim 1, wherein
 an upper surface having a predetermined width of the strip-shaped decorative member is exposed from the front panel and an operational switch is arranged on the exposed upper surface.

* * * * *